US010624197B2

(12) United States Patent
Weilguni et al.

(10) Patent No.: US 10,624,197 B2
(45) Date of Patent: Apr. 14, 2020

(54) PLASMA GENERATOR AND METHOD FOR SETTING AN ION RATIO

(71) Applicant: EPCOS AG, München (DE)

(72) Inventors: Michael Weilguni, Hagenberg (AT); Markus Puff, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/753,530

(22) PCT Filed: Jul. 28, 2016

(86) PCT No.: PCT/EP2016/068094
§ 371 (c)(1),
(2) Date: Feb. 19, 2018

(87) PCT Pub. No.: WO2017/029099
PCT Pub. Date: Feb. 23, 2017

(65) Prior Publication Data
US 2018/0249569 A1   Aug. 30, 2018

(30) Foreign Application Priority Data
Aug. 18, 2015 (DE) .................. 10 2015 113 656

(51) Int. Cl.
H01H 1/24 (2006.01)
H05H 1/24 (2006.01)
C02F 1/30 (2006.01)
H01L 41/04 (2006.01)
H01L 41/107 (2006.01)

(52) U.S. Cl.
CPC ............. H05H 1/2475 (2013.01); C02F 1/30 (2013.01); H01L 41/044 (2013.01); H01L 41/107 (2013.01); H05H 2001/2481 (2013.01)

(58) Field of Classification Search
None
See application file for complete search history.

(56) References Cited

U.S. PATENT DOCUMENTS

| 5,883,934 A | * | 3/1999 | Umeda | H05F 3/06 361/213 |
| 6,002,600 A | * | 12/1999 | Scapellati | H02M 3/28 363/61 |
| 6,850,403 B1 | * | 2/2005 | Gefter | H01T 23/00 361/225 |
| 7,821,762 B2 | | 10/2010 | Yasuoka et al. | |
| 7,973,292 B2 | | 7/2011 | Tsumori et al. | |
| 9,125,284 B2 | * | 9/2015 | Oldynski | H05F 3/06 |
| 2003/0001479 A1 | * | 1/2003 | Aiki | H01T 23/00 313/325 |

(Continued)

FOREIGN PATENT DOCUMENTS

| DE | 10230585 A1 | 1/2003 |
| DE | 102008018827 A1 | 10/2009 |

(Continued)

Primary Examiner — Michael J Logie
(74) Attorney, Agent, or Firm — Slater Matsil, LLP

(57) ABSTRACT

A plasma generator and a method for setting an ion ratio. In an embodiment a plasma generator includes a piezoelectric transformer suitable for ionizing a process gas, an ion separation electrode and a drive circuit suitable for applying a potential to the ion separation electrode.

9 Claims, 1 Drawing Sheet

(56) References Cited

U.S. PATENT DOCUMENTS

| | | | | |
|---|---|---|---|---|
| 2003/0011956 A1* | 1/2003 | Aiki | ........................ | H01T 23/00 361/230 |
| 2006/0072279 A1* | 4/2006 | Gefter | ..................... | H01T 23/00 361/220 |
| 2007/0159762 A1* | 7/2007 | Okano | .................... | H01T 19/00 361/212 |
| 2008/0232021 A1* | 9/2008 | Gefter | ..................... | H01T 23/00 361/213 |
| 2009/0122941 A1* | 5/2009 | Engemann | ............ | H01L 41/107 376/145 |
| 2010/0090096 A1* | 4/2010 | Tsumori | .................. | H01T 23/00 250/251 |
| 2011/0096457 A1* | 4/2011 | Gefter | ..................... | H01T 23/00 361/230 |
| 2012/0126041 A1* | 5/2012 | Nunomura | ............ | B05B 5/0531 239/699 |
| 2012/0200982 A1* | 8/2012 | Partridge | .................. | B03C 3/38 361/213 |
| 2015/0373824 A1* | 12/2015 | Nettesheim | ........... | H01L 41/053 315/111.21 |
| 2016/0284970 A1* | 9/2016 | Kraxner | ................. | H01L 41/107 |
| 2016/0341697 A1* | 11/2016 | Lal | ......................... | G01N 27/64 |
| 2017/0208675 A1* | 7/2017 | Doellgast | .............. | H01L 41/107 |
| 2018/0249569 A1 | 8/2018 | Weilguni et al. | | |

FOREIGN PATENT DOCUMENTS

| | | | | |
|---|---|---|---|---|
| JP | 2001102195 A | 4/2001 | | |
| JP | 2003017218 A | 1/2003 | | |
| JP | 2003217894 A | 7/2003 | | |
| JP | 2008153132 A | 7/2008 | | |
| JP | 2009129673 A | 6/2009 | | |
| WO | WO-2009127297 A1 * | 10/2009 | ........... | H05H 1/2475 |
| WO | 2013043293 A1 | 3/2013 | | |
| WO | 2017029099 A1 | 2/2017 | | |

* cited by examiner

PLASMA GENERATOR AND METHOD FOR SETTING AN ION RATIO

This patent application is a national phase filing under section 371 of PCT/EP2016/068094, filed Jul. 28, 2016, which claims the priority of German patent application 10 2015 113 656.2, filed Aug. 18, 2015, each of which is incorporated herein by reference in its entirety.

TECHNICAL FIELD

The present invention relates to a plasma generator and to a method for setting the ratio of positive to negative ions in a plasma generated by a plasma generator. In this case, the ratio of positive to negative ions denotes the ratio of a number of positive ions to the number of negative ions in the plasma. The plasma jet output at a process gas outlet of the plasma generator is taken into consideration here.

BACKGROUND

In the case of a piezoelectric transformer, in a manner governed by its functional principle, a plasma is generated by means of a sinusoidal output voltage. In this case, the rising edges and the falling edges of the output voltage generated at the piezoelectric transformer have the same steepness. The generation of positive and negative ions in a process gas is largely dependent on the steepness of said edges. On account of the functional principle of the piezoelectric transformers, the steepness of the edges cannot be configured differently.

Consequently, the ratio of positive to negative ions in the plasma generated by the piezoelectric transformer is defined for a predetermined composition of a process gas.

However, there are numerous applications of atmospheric, non-thermal plasma in which the capability of setting a specific ratio of positive to negative ions is advantageous. These include, for example, applications in which atmospheric, non-thermal plasma is used for purifying water.

SUMMARY OF THE INVENTION

Embodiments of the present invention provide generating plasma by a piezoelectric transformer and set a ratio of positive to negative ions in a desired manner.

In various embodiments a plasma generator is proposed, wherein the plasma generator comprises a piezoelectric transformer suitable for ionizing a process gas, an ion separation electrode, and a drive circuit suitable for applying a potential to the ion separation electrode.

The piezoelectric transformer can be, in particular, a Rosen-type plasma generator. The piezoelectric transformer can generate plasma in which it ionizes a process gas. The process gas can be air or a noble gas, for example. The process gas can be ionized by a high voltage generated at an output side of the piezoelectric transformer. In this case, an environment of the transformer functions as a counter electrode.

In various further embodiments the ion separation electrode is arranged at such a distance from the piezoelectric transformer that it cannot be regarded as a counter electrode with respect to the transformer. If a potential is applied to the ion separation electrode, then the latter attracts ions having an opposite charge and repels ions of like charge. In this case, a portion of the ions attracted by the ion separation electrode is deflected to such a great extent that it impinges on the ion separation electrode or at least does not reach an output of the plasma generator and is thus not contained in the plasma jet output by the plasma generator. Therefore, it is possible to reduce the proportion of the ions of this charge in the plasma.

The potential present at the ion separation electrode can be set by means of the drive circuit. This makes it possible always to set the ratio of positive and negative ions in a desired manner.

The use of the ion separation electrode can thus make it possible, even in the case of plasma generation by means of a piezoelectric transformer in which firstly the ratio of positive to negative ions is defined by the composition of the process gas and by the functioning of the piezoelectric transformer, to set said ratio in a desired manner. In this way, it is possible to utilize the advantages of piezoelectric transformers over other methods of plasma generation and at the same time to generate a plasma having a desired ratio of positive and negative ions. In particular, the high efficiency of the piezoelectric transformer is a major advantage of plasma generation by means of a piezoelectric transformer.

Furthermore, the plasma generator could comprise means for detecting the ratio of positive and negative ions. The drive circuit could readjust the potential present at the ion separation electrode depending on the measurement values of the means for detecting the ratio.

The plasma generator can be suitable for a process gas to flow through it, wherein the process gas is ionized by the piezoelectric transformer and is subsequently guided through the ion separation electrode. In this case, a variation of the ratio of positive to negative ions in the process gas can be performed in the ion separation electrode.

The potential present at the ion separation electrode can in particular define the ratio of positive and negative ions in a plasma generated by the plasma generator.

The plasma generator can comprise a tube, which connects a process gas inlet and a process gas outlet, wherein the piezoelectric transformer and the ion separation electrode are arranged in the tube, wherein the ion separation electrode is arranged between the piezoelectric transformer and the process gas outlet. The tube can be formed, for example, by a housing of the plasma generator.

The drive circuit can be adjustable in such a way that the potential present at the ion separation electrode is variable. In this way, it is possible to set any desired ratio of positive to negative ions in the plasma generated by the plasma generator.

The drive circuit can comprise a transformer suitable for generating an AC output voltage and a circuit for rectifying and smoothing the AC output voltage, wherein the circuit for rectifying and smoothing the AC output voltage is connected to the ion separation electrode. Accordingly, the circuit can apply a potential to the ion separation electrode. This can be a quasi-static potential, in particular. The transformer can be a second piezoelectric transformer, in particular.

The ion separation electrode can be grid-shaped or comprise a metal tube. Both shapings are particularly well suited to filtering out ions from a plasma jet guided through the ion separation electrode. The respective shaping of the ion separation electrode can furthermore also influence the shape of the plasma jet in a desired manner.

The piezoelectric transformer can be suitable for generating atmospheric, non-thermal plasma.

The drive circuit can comprise at least one diode. The drive circuit can be configured to reverse the polarity of a potential applied to the diode. By inverting the potential present at the diode, it is possible to invert the ratio of positive ions generated and negative ions generated.

The piezoelectric transformer can comprise an end face and be configured to directly ionize a process gas by means of a high voltage generated at its end face. The end face can be an end side of an input side of the piezoelectric transformer.

In particular, the piezoelectric transformer can comprise an input side and an output side directly adjacent to the input side. The input side can comprise a multilayer structure in which piezoelectric layers and first and second internal electrodes arranged therebetween are stacked one above another. The output side can comprise a piezoelectric material and a monolithic structure.

During the operation of the piezoelectric transformer, an AC voltage can be applied to the first and second internal electrodes of the input side, said AC voltage exciting piezoelectric oscillations in the stacking direction between the internal electrodes. As a result, a wave can form which continues in the longitudinal direction. In this way, a high voltage can be generated at the end face on the output side. By means of said high voltage, a process gas, for example, air, can be ionized and an atmospheric, non-thermal plasma can be generated in this way.

The ionization is referred to as "direct" if the process gas is ionized at the end face itself. This is in contrast to an indirect ionization, in which the high voltage is tapped off from the end face and is applied to a further element, for example, an electrode, in order to ionize the process gas at said element. Direct ionization has the advantage that in this case energy losses can be minimized and a compact set-up of the plasma generator is made possible. By way of example, the plasma generator can be integrated into a portable handheld device.

A further aspect of the present invention relates to a method for setting the ratio of positive to negative ions in a plasma generated by a plasma generator. The plasma generator can be, in particular, the plasma generator described above. Accordingly, every structural or functional feature that was disclosed in association with the plasma generator can also apply to the method. Every feature disclosed in association with the method can correspondingly also apply to the plasma generator. A method is proposed for a plasma generator comprising a piezoelectric transformer, an ion separation electrode and a drive circuit. The method comprises the following steps:—causing a process gas to flow through the plasma generator, which process gas is ionized by the piezoelectric transformer and is subsequently guided through the ion separation electrode, and—setting the potential applied to the ion separation electrode by the drive circuit for the purpose of setting the ratio of positive to negative ions.

As described above, this method makes it possible to generate a plasma in which the ratio of positive to negative ions is set in a desired manner, the advantages of a piezoelectric transformer being used during plasma generation. They include, in particular, the high efficiency of the piezoelectric transformer.

The drive circuit can comprise a transformer, to which an AC input voltage is applied and which generates an AC output voltage. In the method, the step of setting the potential applied to the ion separation electrode by the drive circuit can be carried out by the input voltage present at the transformer being varied.

The drive circuit can comprise at least one diode. The method can comprise the following step:—inverting the diode for reversing the polarity of the potential applied to the ion separation electrode and for inverting the ratio of positive and negative ions.

BRIEF DESCRIPTION OF THE DRAWINGS

The present invention is described in greater detail below with reference to the figures.

DETAILED DESCRIPTION OF ILLUSTRATIVE EMBODIMENTS

Figure 1:
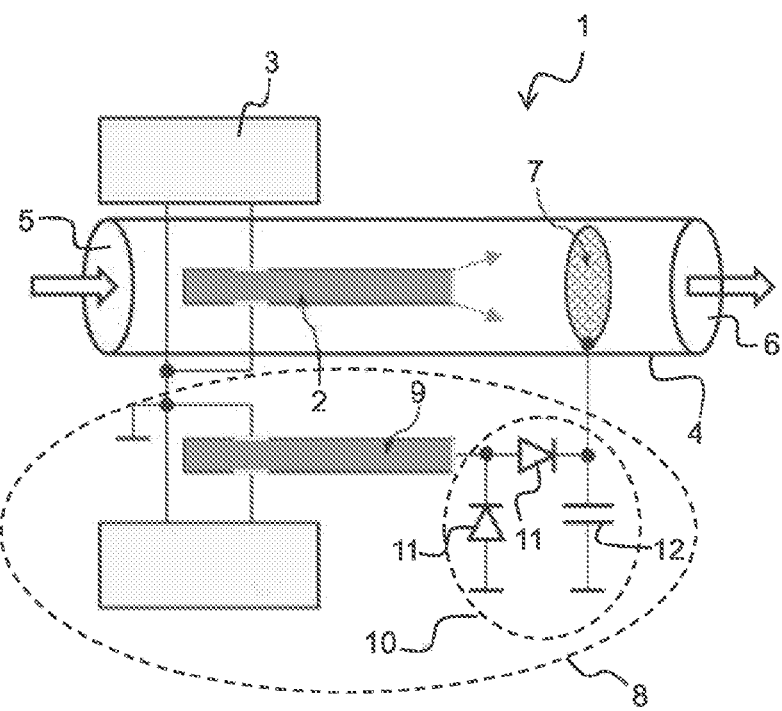
FIG. 1 shows a first exemplary embodiment of the plasma generator.

FIG. 1 shows a first exemplary embodiment of a plasma generator 1, in the case of which it is possible to set a ratio of positive ions to negative ions in the generated plasma. The plasma generator 1 comprises a piezoelectric transformer 2. The piezoelectric transformer 2 is suitable for ionizing a process gas and thereby generating a plasma.

The piezoelectric transformer 2 is a Rosen-type piezoelectric transformer. The piezoelectric transformer 2 is suitable for generating plasma by means of a piezoelectric direct discharge (PDD).

The piezoelectric transformer 2 comprises an input side and an output side. On the input side, the piezoelectric transformer 2 comprises a multilayer structure, in which piezoelectric layers and first and second internal electrodes arranged therebetween are stacked one above another. The piezoelectric layers comprise a lead zirconate titanate (PZT) ceramic. On the input side, the piezoelectric layers are polarized in the stacking direction. The internal electrodes consist of copper.

In a stacking direction, a first internal electrode and a second internal electrode are arranged alternately in each case between two piezoelectric layers. The first internal electrodes are led out to a first external side of the piezoelectric transformer 2 and are spaced apart from a second external side. The second internal electrodes are spaced apart from the first external side and are led out to the second external side. Furthermore, external electrodes are respectively arranged on the first external side and the second external side, said external electrodes being electrically contacted with the internal electrodes led out to the respective external side.

On the output side, the piezoelectric transformer 2 comprises a monolithic structure. The output side comprises the same piezoelectric material as the input side. The output side of the piezoelectric transformer 2 is polarized in the longitudinal direction.

During the operation of the piezoelectric transformer 2, an AC voltage is applied to the external electrodes on the input side, said AC voltage exciting piezoelectric oscillations in the stacking direction between the internal electrodes. As a result, a wave can form, which continues in the longitudinal direction. In this way, a high voltage can be generated at an end face on the output side. By means of said high voltage, a process gas, for example, air, can be ionized and an atmospheric, non-thermal plasma can be generated in this way.

During the operation of the piezoelectric transformer 2, the environment of the transformer acts as a counter electrode. This is a so-called "floating electrode". Particularly at the edges and corners of the output side of the piezoelectric transformer, a high field gradient arises, such that the latter ionizes the process gas. The high field gradient can arise as a result of a potential being present at the output side, which potential is high when considered in relation to a reference potential, which can be a ground potential, for example.

The piezoelectric transformer 2 is interconnected with a first drive circuit 3. The first drive circuit 3 is designed to apply the input voltage to the external electrodes of the piezoelectric transformer 2. The input voltage is an AC voltage. The frequency of the input voltage preferably corresponds to the resonant frequency of the piezoelectric transformer 2. The resonant frequency is determined by the geometry of the piezoelectric transformer 2. It can be between 10 and 1000 kHz. Preferably, the resonant frequency can be between 20 and 100 kHz, for example, 50 kHz.

The plasma generator 1 furthermore comprises a tube 4, which connects a process gas inlet 5 to a process gas outlet 6. During the operation of the plasma generator 1, a process gas can flow through the tube 4. The process gas flow is indicated by a respective arrow at the process gas inlet 5 and at the process gas outlet 6 in FIG. 1. The process gas can be air or a noble gas, for example.

In the tube 4, a fan can be arranged at the process gas inlet 5, said fan drawing in ambient air. Alternatively, the process gas inlet 5 cold be connected to a compressed air reservoir. A nozzle can be arranged at the process gas outlet 6, said nozzle making it possible to output a generated plasma in a plasma jet of a desired shape.

The piezoelectric transformer 2 is arranged in the tube 4 and the process gas accordingly flows around said piezoelectric transformer during the operation of the plasma generator 1. In this case, the process gas is ionized at the output side of the piezoelectric transformer 2. The ionization is likewise indicated by arrows in FIG. 1. The ratio of positive ions to negative ions in the plasma generated at the output side of the piezoelectric transformer 2 is predetermined by the composition of the process gas.

In the present plasma generator 1, it is now possible, however, to vary said predetermined ratio of positive to negative ions. For this purpose, the plasma generator 1 comprises an ion separation electrode 7, which is arranged in the tube. The ion separation electrode 7 is arranged between the piezoelectric transformer 2 and the process gas outlet 6. Accordingly, the process gas ionized by the piezoelectric transformer 2 is guided past the ion separation electrode 7. In this case, the ion separation electrode 7 is arranged at such a distance from the piezoelectric transformer 2 that it does not function as a counter electrode of the transformer. The plasma generator 1 furthermore comprises a second drive circuit 8. The second drive circuit 8 makes it possible to apply a potential to the ion separation electrode 7.

In the case of the exemplary embodiment shown in FIG. 1, the second drive circuit 8 is configured to apply a positive potential with respect to a reference potential, for example, a ground potential, to the ion separation electrode 7. Accordingly, the ion separation electrode 7 will attract the negative ions of the ionized process gas and repel the positive ions of the ionized process gas. In this case, a portion of the negative ions is attracted by the ion separation electrode 7 in such a way that the negative ions impinge on the ion separation electrode 7 and thus do not reach the process gas outlet 6. In this way, it is possible to reduce the proportion of negative ions in the plasma output by the plasma generator 1 and thus to vary the ratio of positive to negative ions.

The plasma generator 1 accordingly uses a principle which corresponds to that of a vacuum triode, wherein here the gas flow is responsible for the ion transport, rather than a voltage between an anode and a cathode, as in the case of the vacuum triode.

However, not all of the negative ions in the process gas are attracted by the ion separation electrode 7 to such a great extent that they do not reach the process gas outlet 6. Rather, only a portion of the negative ions is deflected by the ion separation electrode 7 to such a great extent that said ions do not reach the process gas outlet 6. Accordingly, a partial separation takes place.

If the potential present at the ion separation electrode 7 is then increased or decreased, the proportion of the negative ions which are filtered out of the process gas flow can be increased or respectively decreased as a result.

The second drive circuit 8 comprises a transformer 9. The transformer 9 can be, for example, a second piezoelectric transformer. The second drive circuit 8 applies an AC input voltage to an input side of the transformer 9. An AC output voltage can be tapped off at an output side of the transformer 9. Said voltage is a high voltage. The second drive circuit 8 is configured in such a way that the input voltage applied to the transformer 9 is adjustable. The potential present at the ion separation electrode 7 can be varied by way of the setting of said input voltage.

The output of the transformer 9 is connected to a circuit 10 for rectifying and smoothing the AC output voltage. Said circuit 10 converts the high AC voltage generated by the transformer 9 into a quasi-static high voltage. The circuit 10 for rectifying and smoothing comprises two diodes 11 and a capacitor 12. The high voltage generated by the transformer 9 is rectified via the two diodes 11. The voltage is smoothed by means of the capacitor 12. In the exemplary embodiment shown in FIG. 1, a potential that is positive with respect to ground is generated in this way, said potential being present at the ion separation electrode 7.

The second drive circuit 8 is furthermore configured in such a way that the diodes 11 can be reversed, such that a negative potential is generated in this case, said negative potential being present at the ion separation electrode 7. In this case, the positive ions are attracted by the ion separation electrode 7. Accordingly, the proportion of positive ions in the plasma is reduced and in this way too, the ratio of positive to negative ions can be set in a desired manner.

The second drive circuit 8 can furthermore comprise switching elements that make it possible to switch between a configuration for generating a negative potential and a configuration for generating a positive potential. Said switching elements can be two high-voltage reed relays.

In the case of the exemplary embodiment shown in FIG. 1, the ion separation electrode 7 is grid-shaped. In this case, it has a diameter that is only slightly smaller than the diameter of the tube 4. Accordingly, almost the entire ionized process gas is guided through the openings in the grid. An effective separation of the ions can be performed in this way.

Figure 2:
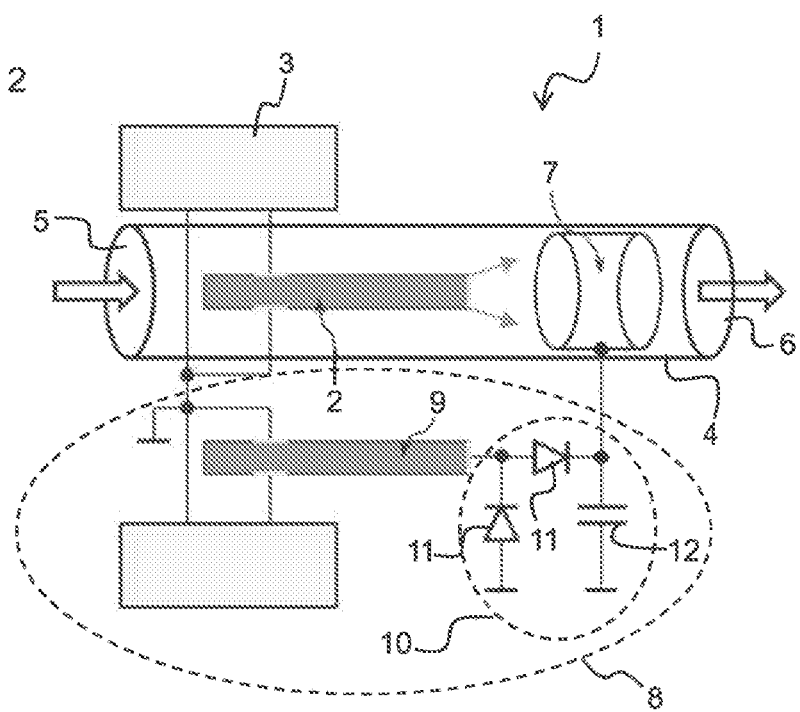
FIG. 2 shows a second exemplary embodiment of the plasma generator.

FIG. 2 shows a second exemplary embodiment of the plasma generator 1. The exemplary embodiment shown in FIG. 2 differs from the exemplary embodiment in FIG. 1 in the configuration of the ion separation electrode 7. The ion separation electrode 7 here is formed by a metal tube. The metal tube is arranged concentrically in the tube 4.

If, by way of example, a positive potential is present at the ion separation electrode 7, now in the metal tube negative ions are deflected outward in a radial direction. Positive ions are focused in the center of the ion separation electrode 7. In this way, it can be possible to set the ion distribution in the generated plasma jet in such a way that the proportion of positive ions is increased since a certain proportion of the negative ions is deflected to such a great extent that it does not reach the process gas outlet 6.

If the polarity of the potential present at the ion separation electrode 7 is reversed, then analogously negative ions are focused within the plasma jet and positive ions are deflected outward in a radial direction.

By means of the second drive circuit 8, it is possible to set the potential present at the ion separation electrode 7 in a desired manner and thus to set the ratio of positive to negative ions.

The invention claimed is:

1. A plasma generator comprising:
   a piezoelectric transformer comprising an end face and configured to directly ionize a process gas by a high voltage generated at the end face;
   an ion separation electrode; and
   a drive circuit configured to apply a potential to the ion separation electrode,
   wherein the process gas is ionized at the end face itself,
   wherein the drive circuit comprises at least one diode, and
   wherein the drive circuit is configured to reverse a polarity of a potential applied to the diode, thereby inverting a ratio of positive ions generated and negative ions generated, and
   wherein the drive circuit has two high-voltage reed relays to switch between a positive potential and a negative potential.

2. The plasma generator according to claim 1, wherein the plasma generator is suitable for the process gas to flow through it, and wherein the process gas is ionized by the piezoelectric transformer and is subsequently guided through the ion separation electrode.

3. The plasma generator according to claim 1, wherein the potential at the ion separation electrode defines the ratio of the positive and negative ions in a plasma generated by the plasma generator.

4. The plasma generator according to claim 1, further comprising a tube connecting a process gas inlet and a process gas outlet, wherein the piezoelectric transformer and the ion separation electrode are arranged in the tube, and wherein the ion separation electrode is arranged between the piezoelectric transformer and the process gas outlet.

5. The plasma generator according to claim 1, wherein the drive circuit is adjustable such that the potential at the ion separation electrode is variable.

6. The plasma generator according to claim 1, wherein the drive circuit comprises a drive circuit transformer configured to generate an AC output voltage and a circuit configured to rectify and smooth the AC output voltage, and wherein the circuit configured to rectify and smooth the AC output voltage is connected to the ion separation electrode.

7. The plasma generator according to claim 1, wherein the ion separation electrode is grid-shaped.

8. The plasma generator according to claim 1, wherein the ion separation electrode comprises a metal tube.

9. The plasma generator according to claim 1, wherein the piezoelectric transformer is configured to generate an atmospheric, non-thermal plasma.

* * * * *